(12) United States Patent
Barnes

(10) Patent No.: US 6,611,929 B1
(45) Date of Patent: Aug. 26, 2003

(54) TEST CIRCUIT FOR MEMORY

(75) Inventor: William Barnes, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/488,173

(22) Filed: Jan. 20, 2000

(30) Foreign Application Priority Data

Jan. 22, 1999 (GB) .............................................. 9901494

(51) Int. Cl.$^7$ .............................................. G11C 29/00
(52) U.S. Cl. ...................................................... 714/718
(58) Field of Search .......................................... 714/718

(56) References Cited

U.S. PATENT DOCUMENTS

| | | |
|---|---|---|
| 3,961,252 A | 6/1976 | Eichelberger ................. 324/73 |
| 4,903,266 A | 2/1990 | Hack et al. |
| 5,033,048 A | 7/1991 | Pierce et al. |
| 5,781,562 A | 7/1998 | Saxena et al. |
| 5,848,074 A | 12/1998 | Maeno |

FOREIGN PATENT DOCUMENTS

| | | | |
|---|---|---|---|
| EP | 0 210 741 | 2/1987 | ........... G01R/31/28 |
| EP | 0 350 538 | 1/1990 | ........... G11C/29/00 |
| EP | 0 370 194 | 5/1990 | ........... G06F/11/26 |
| EP | 0 650 123 | 4/1995 | ........... G06F/11/26 |
| GB | 2 271 898 | 4/1994 | ......... H03K/19/173 |

OTHER PUBLICATIONS

Standard Search Report for application No. GB 9901494.6 filed Jan. 22, 1999.

United Kingdom Search Report from Great Britain application No. 9901494.6, filed Jan. 22, 1999.

*Primary Examiner*—Albert Decady
*Assistant Examiner*—Cynthia Britt
(74) *Attorney, Agent, or Firm*—Wolf, Greenfield & Sacks, P.C.; James H. Morris; Robert A. Skrivanek

(57) ABSTRACT

A test circuit for memory having plural memory cells and address latches responsive to addressing circuitry for reading/writing to said memory cells in a normal mode, has first connecting circuitry for connecting the address latches to form a linear feedback shift register. The linear feedback shift register is responsive to a clock signal to provide a sequence of addresses for testing the memory in a test mode.

9 Claims, 3 Drawing Sheets

TEST CIRCUIT FOR MEMORY

FIELD OF THE INVENTION

The present invention relates to method and apparatus for testing a memory having plural memory cells and plural address latches.

BACKGROUND OF THE INVENTION

It has been long recognized as desirable to provide built-in self test circuitry on a VLSI memory chip.

Such circuitry uses an algorithm such as the March test in which information is sequentially written to all of the memory cells of the array or of a section of the array, followed by reading the information, again in a sequence. Such algorithms typically require traversing the memory in the forward sequence for a number of times and then traversing the memory one or more times in a reverse sequence.

Circuitry for generating the address sequences in the prior art is inefficient partly because of the need to provide extra dedicated test circuitry for sequencing, and also because it is necessary to couple this sequencing circuitry into the conventional addressing circuitry used in the normal operating mode.

It would be desirable to provide sequencing circuitry which occupied less chip area than in the prior art and which was easier to couple into the conventional addressing circuitry.

SUMMARY OF THE INVENTION

According to a first aspect of the present invention there is provided a test circuit for a memory having plural memory cells and plural address latches responsive to addressing circuitry for reading from or writing to said memory cells in a normal mode, said test circuit having first connecting circuitry for connecting said address latches to form a linear feedback shift register, said linear feedback shift register being responsive to a clock signal to provide a first sequence of addresses for testing said memory in a test mode.

Preferably said linear feedback shift register is configured such that said first address sequence addresses substantially all of said memory cells.

Preferably said test circuit further comprises second connection circuitry for connecting said address latches to form a second linear feedback shift register responsive to said clock signal to provide a second sequence of addresses wherein said second sequence is the reverse of said first sequence.

According to a second aspect of the present invention there is provided a method of testing a memory having plural memory cells and plural address latches responsive to addressing circuitry for reading from or writing to said memory cells in a normal mode comprising:

connecting said address latches to form a linear feedback shift register;

clocking said linear feedback shift register to provide a first sequence of addresses;

using said first sequence of addresses to address said memory cells for testing thereof.

BRIEF DESCRIPTION OF THE DRAWINGS

A preferred embodiment of the present invention will now be described by way of example only, with respect to the following drawings in which:

FIG. 5 shows the logic states achievable by the shift register of FIG. 3, in sequence and;

FIG. 6 shows the logic states achievable by the shift register of FIG. 4, in sequence.

DESCRIPTION OF THE PREFERRED EMBODIMENTS

Figure 1:
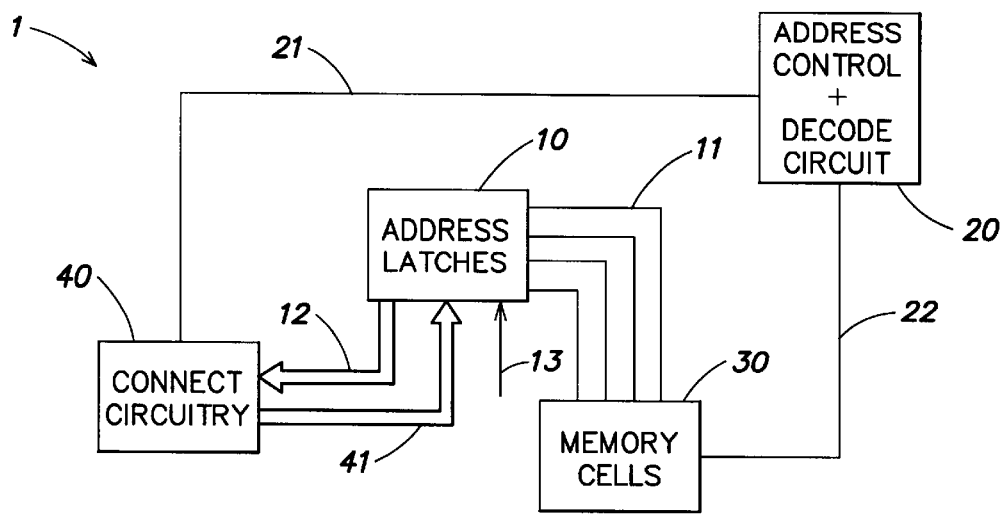
FIG. 1 shows a block diagram of a memory circuit including a test circuit in accordance with the present invention.

In the various figures like reference numerals refer to like parts.

Referring firstly to FIG. 1, a memory array 1 has a matrix 30 of memory cells, access to which is provided in normal operation via address latches 10 over plural address lines 11. The memory is an SRAM (static random access memory) but the invention is equally applicable to dynamic access random access memories (DRAM).

The latches are clocked by a synchronous clock on line 13.

Conventionally, an address control and decoder circuit 20 is connected to the cell matrix via a control line 22 and to the address latches via an output line. In the present invention, connect circuitry 40 is provided which allows the address latches to be connected together to function as conventional address latches in a normal mode but also to be connected together to form a linear feedback shift register arrangement in a test mode. The connector circuitry 40 thus receives the output line 21 from the address control and decoder circuit 20. The connect circuitry also receives a control input 12 which in a first state causes the connect circuitry to configure the latches as conventional address latches and in an opposite state connects the latches to form the above-described shift register. Before referring to FIG. 2 linear feedback shift registers will be described with reference to FIGS. 3 and 4.

A first linear feedback shift register 100 will be described with respect to FIG. 3. The shift register consists of four synchronous latches 101–104, having outputs 101a–104a, connected in series, with the input to the first latch 101 provided by the output of an exclusive OR 105 whose two inputs are derived respectively from the output 101a of the first latch 101 and the output 104a of the fourth latch 104. In operation, a logic 1 at the input to a respective latch will progress to the output of that latch upon a clock pulse transition, the presence of a logic 1 or 0 at the input to the first latch 101 being determined according to whether the output of the first latch differs in logic state from the output of the fourth latch or whether the two outputs are the same.

Figures 5, 6:
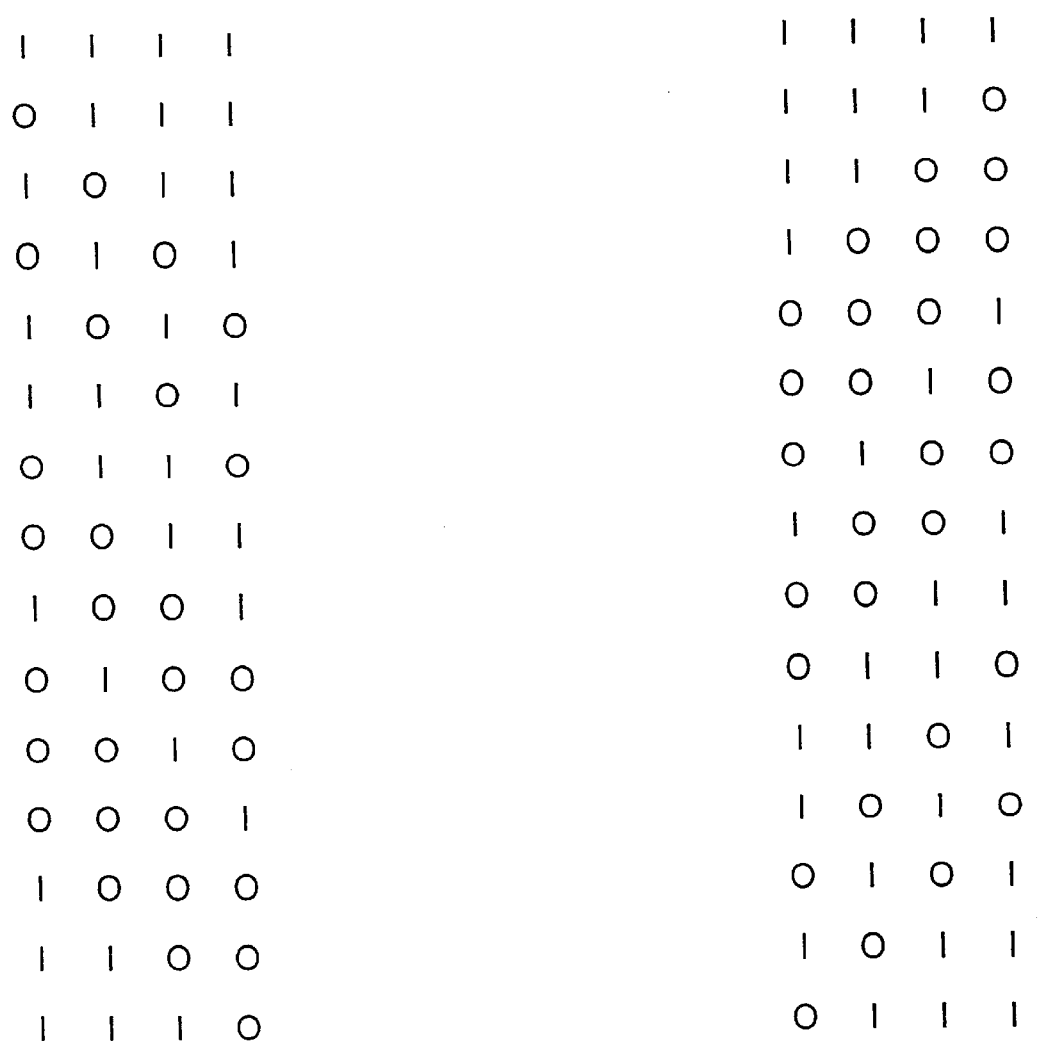

FIG. 5 shows a sequence of logic states which are provided by the outputs 101a–104a of the linear feedback shift register 100 and it will be noted that all of these states from 15 to 1 are covered.

It will be further noted that the linear feedback shift register 100 does not pass through the logic state 0000.

A second linear feedback shift register 200 will now be described with respect to FIG. 4. The second linear feedback shift register 200 also has four synchronous latches and an exclusive OR gate but the interconnections are different to those of the first feedback shift register 100 described with respect to FIG. 3. The left hand most latch 201 has an input derived from the output of the second latch 202 and the output of the first latch 201 and of the second latch 202 form the inputs to the exclusive OR gate 205. The output of the exclusive OR gate 205 provides the input to the fourth latch 204 whose output in turn provides the input to the third latch

203. The output of the third latch 203 provides the input to the second latch 202. Referring now to FIG. 6, a sequence of states provided by the outputs 201*a*–204*a* of the second linear feedback shift register 200 is shown, starting as in Table 1 from the state 1111.

Comparison between FIG. 5 and FIG. 6 shows that the sequence of FIG. 6 is the reverse of that shown in FIG. 5.

Figure 3:
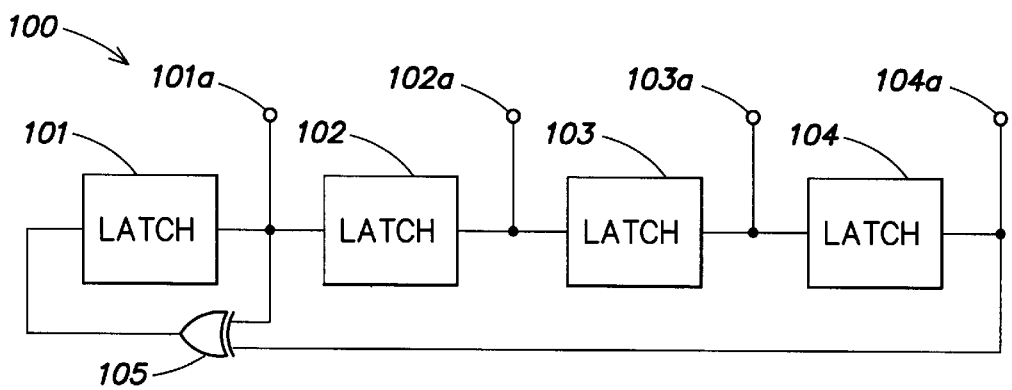
FIG. 3 shows a block diagram of a first linear feedback shift register useful in understanding the present invention.
Figure 4:
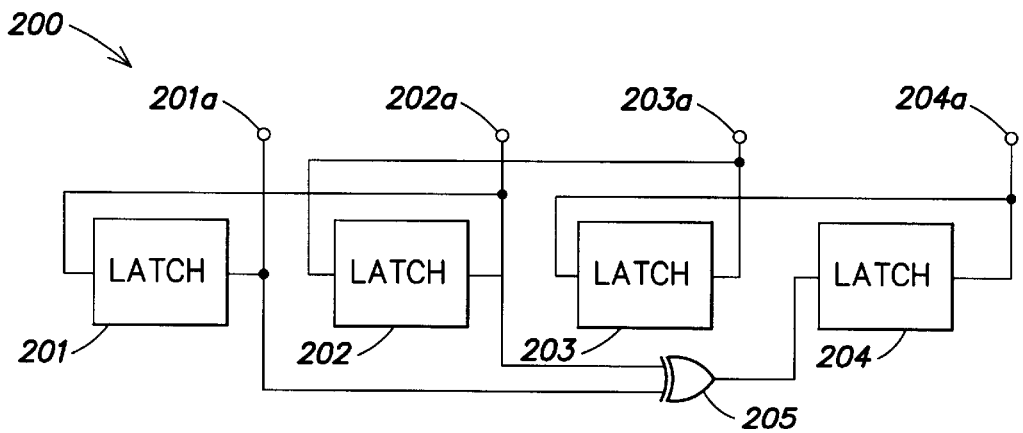
FIG. 4 shows a block diagram of a second linear feedback shift register useful in understanding the present invention.

It will be appreciated by those skilled in the art that the configuration of the linear feedback shift register shown in FIGS. 3 and 4 is appropriate only for a four bit shift register; where higher number of bits are required, as will be the case in most memories, different configurations of latches, logic gates and taps will be provided using known design techniques.

Figure 2:
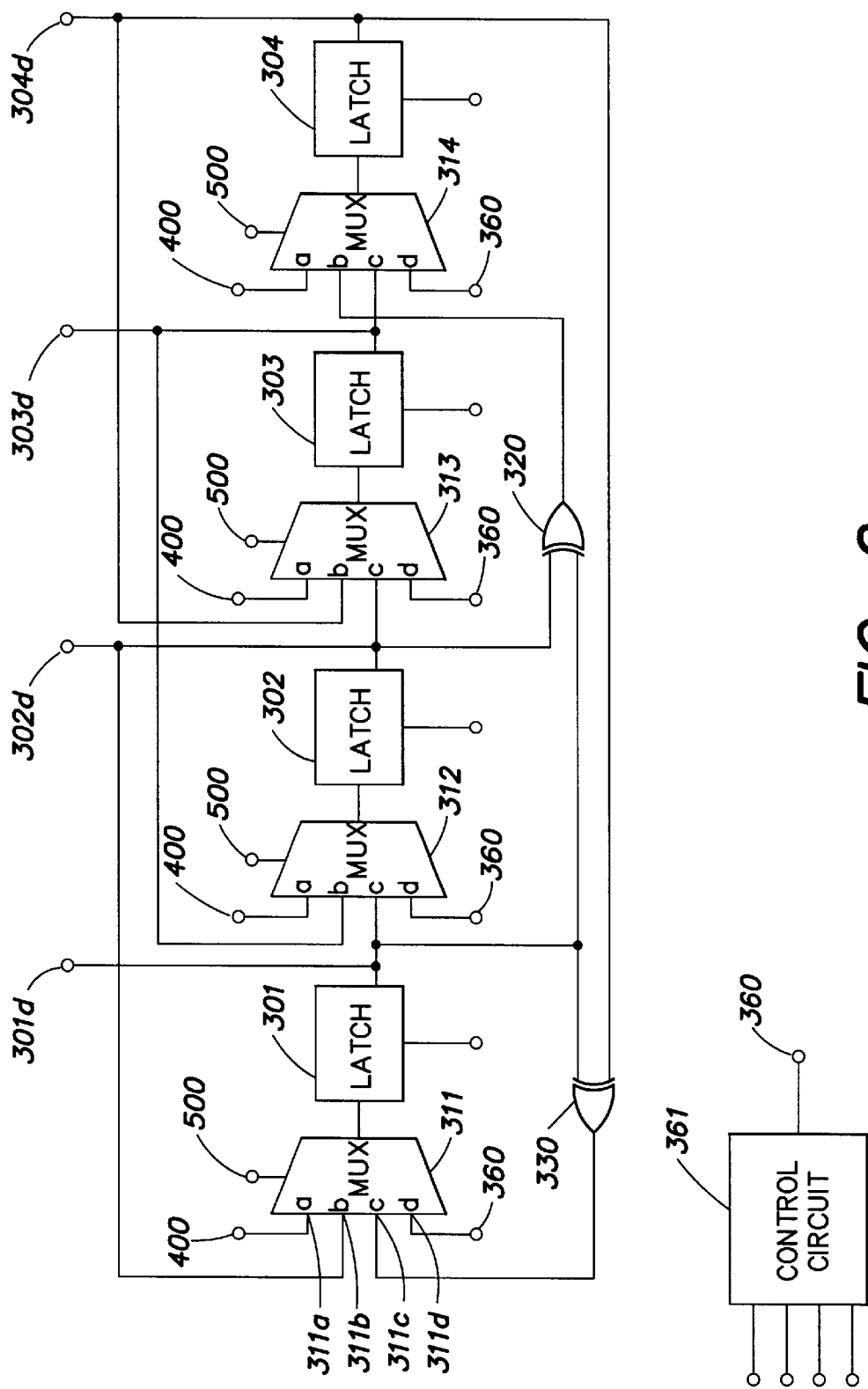
FIG. 2 shows a partial circuit diagram of a test circuit in accordance with the present invention.

FIG. 2 shows four synchronous latches 301–304. The input to the first latch 301 is provided by the output of a four input multiplexer 311, that to second latch 302 is provided by a second four input multiplexer 312, that to third latch 303 by third four input multiplexer 313 and that to the fourth latch 304 is provided a fourth four input multiplexer 314. A first input 311*a*, 312*a*, 313*a*, 314*a* of each multiplexer is connected to an address input terminal 400. The second input 311*b* of the first multiplexer 311 is connected to the output of the second latch 302. The second input 312*b* of the second multiplexer 312 is connected to the output of the third latch 303 and the second input 313*b* of the third multiplexer 313 is connected to the output of the fourth latch 304. A first exclusive OR gate 320 receives a first input from the output of the first latch 301 and a second input from the output of the second latch 302. The output of the first exclusive OR gate 320 provides the second input 314*b* of the fourth multiplexer 314*d*.

A second exclusive OR gate 330 has one input connected to the output of the first latch 301 and a second input connected to the output of the fourth latch 304. The output of the second exclusive OR gate provides the third input 311*c* of the first multiplexer 311. The third inputs 312*c*, 313*c*, and 314*c* of the second, third and fourth multiplexers are provided by the outputs of the respective immediately preceding latch 301, 302, and 303. The fourth input 311*d*, 312*d*, 313*d*, and 314*d* are connected in common and to the output 360 of a control circuit 361. The latches 301–304 each have a respective output 301*d*–304*d*.

As known to those skilled in the art, each multiplexer receives a control signal at a control input 500 and according to the state of the control signal the output of the multiplexer is connected to one of the first, second, third or fourth inputs of the multiplexer in question. In the present case a single control signal is provided to all of the multiplexers.

Comparison of the shift register arrangement shown in FIG. 2 with that shown in FIGS. 3 and 4 shows that in a first condition in which the third input to each multiplexer is provided as its respective output, it will be seen that the circuit corresponds to that shown in FIG. 3. In a second state in which each multiplexer is provided with the signal at its second input as its output, the circuit of FIG. 2 corresponds to that described with respect to FIG. 4.

As noted previously with respect to the discussion of FIGS. 3 and 4, the linear feedback shift register circuit is not capable of assuming the 11000011 state. To overcome this problem, so that the linear feedback shift register circuitry of FIG. 2 can include all 16 output states, the control circuitry 361 outputs onto the fourth input of each multiplexer a logical 0 when it detects in test mode that the four address outputs are about to assume logical 1. At that time, the control input to the multiplexers is set to supply the fourth multiplexer input to the output of the multiplexer so that upon the next clock transition each of the latches 301-4 are set to logic 0. It will be understood that this all zeros condition results in a lock up of the shift register which must therefore be reset to a suitable value from which it can proceed, in this case an all one's state.

In the normal operational mode, the first inputs 400 are set to the relevant address supplied by the address control and decoder circuitry 20 and upon the next clock transition, the latches 301-4 provide at their outputs the corresponding address. When it is desired to provide the built-in self test (BIST) function the control input 12 which provides the control to the multiplexer 311 -314, sets the multiplexers to output either their second, third or respectively fourth inputs depending upon whether the output sequence is desired in one sense, or the opposite sense. As noted above, while the multiplexers pass their third inputs as their outputs, the address outputs of the latches sequence in a first direction to cover all of the memory addresses save the "0000" address, this being supplied by the fourth input 360. When the multiplexer pass their second inputs as their outputs, the address outputs sequence through in the reverse sense.

What is claimed is:

1. A test circuit for a memory having plural memory cells and first address latches responsive to addressing circuitry for reading from or writing to said memory cells in a normal mode, said test circuit having first connecting circuitry for connecting said first address latches to form a linear feedback shift register, said linear feedback shift register being responsive to a clock signal to provide a first sequence of addresses for testing said memory in a test mode, said test circuit further comprising second connection circuitry for connecting said first address latches to form a second linear feedback shift register being responsive to said clock signal to provide a second sequence of addresses wherein said second sequence is different from said first sequence.

2. The test circuit of claim 1 wherein said linear feedback shift register is configured such that said first address sequence addresses substantially all of said memory cells.

3. The test circuit of claim 1 wherein said second sequence is the reverse of said first sequence.

4. The test circuit of claim 3, further comprising circuitry operable in said test mode for providing an output state of said shift register which is not reachable in said first or second sequence.

5. The test circuit of claim 4 wherein said output state is an all-zero state.

6. The test circuit of claim 1, further comprising circuitry operable in said test mode for providing an output state of said shift register which is not reachable in said first sequence.

7. The test circuit of claim 6, wherein said output state is an all-zero state.

8. A method of testing a memory having plural memory cells and first address latches responsive to addressing circuitry for reading from or writing to said memory cells in a normal mode comprising:

connecting said first address latches to form a linear feedback shift register;

clocking said linear feedback shift register to provide a first sequence of addresses;

using said first sequence of addresses to address said memory cells for testing thereof;

connecting said first address latches to form a second linear feedback shift register;

clocking said second linear feedback shift register to provide a second sequence of addresses; and using said second sequence of addresses to address said memory cells for testing thereof, wherein said second sequence different than the first sequence.

9. The method of claim 8 wherein said second sequence is the reverse of the first sequence.

* * * * *